United States Patent
Izumi et al.

(10) Patent No.: US 6,319,741 B1
(45) Date of Patent: Nov. 20, 2001

(54) METHOD FOR FABRICATING METAL INTERCONNECTIONS AND WIRING BOARD HAVING THE METAL INTERCONNECTIONS

(75) Inventors: Yoshihiro Izumi, Kashihara; Yoshimasa Chikama, Souraku-gun, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/615,272

(22) Filed: Jul. 13, 2000

(30) Foreign Application Priority Data

Jul. 16, 1999 (JP) .................................. 11-202883
May 11, 2000 (JP) .................................. 12-138390

(51) Int. Cl.[7] .................................. H01L 21/00
(52) U.S. Cl. ..................... 438/30; 438/625; 438/642; 438/648; 438/650; 438/652; 438/656; 438/669; 438/674; 438/678; 438/685; 438/686; 438/687; 438/688
(58) Field of Search ................. 438/30, 625, 642, 438/648, 650, 652, 656, 669, 674, 678, 685–688

(56) References Cited

U.S. PATENT DOCUMENTS 6,100,194 * 8/2000 Chan et al. ................. 438/686
6,180,523 * 1/2001 Lee et al. ................. 438/678
6,207,599 * 3/2001 Jiang ................. 438/653

FOREIGN PATENT DOCUMENTS 2-83533   3/1990   (JP) .

OTHER PUBLICATIONS

M. Ikeda, et al., "Low Resistance Copper Address Line for TFT–LCD", in Japan Display '89, pp. 498–501.

* cited by examiner

Primary Examiner—John F. Niebling
Assistant Examiner—David A Zarneke
(74) Attorney, Agent, or Firm—Dike, Bronstein, Roberts & Cushman IP Group; David G. Conlin; David A. Tucker

(57) ABSTRACT

A Ni film for a ground metal film is formed on an insulating substrate by direct current magnetron sputtering process, which prevents occurrence of minute protrusions on a surface of the ground metal film. Next, a Ni film is patterned into a specified interconnection form to obtain a patterned Ni film. Then, an anti-corrosive Au film having low resistance is formed on the patterned Ni film by electroless plating process. Further, an inexpensive Cu film having low resistance is formed on the Au film by electroplating process.

18 Claims, 4 Drawing Sheets

METHOD FOR FABRICATING METAL INTERCONNECTIONS AND WIRING BOARD HAVING THE METAL INTERCONNECTIONS

BACKGROUND OF THE INVENTION

The present invention relates to a method for fabricating metal interconnections used for flat panel displays such as liquid crystal displays (LCD), plasma display panels (PDP), electrochromic displays (ECD) and electroluminescent displays (ELD), as well as for printed wiring boards using ceramic substrates, or in other various fields.

In a flat panel display typified by LCDs, normally, display material such as liquid crystals or discharge gas is sandwiched between a pair of substrates, and a voltage is applied to the display material. In this case, metal interconnection lines made of electrically conductive material are arrayed on at least one of the substrates.

For example, in the case of an active matrix drive type LCD, gate electrodes and data electrodes are disposed in a matrix shape on one substrate (active matrix substrate), which is one of the pair of substrates between which the display material is sandwiched and held. A thin film transistor (TFT) and a pixel electrode are provided at each intersection of those electrodes. Generally, these gate electrodes and data electrodes are made of metal material such as Ta, Al or Mo, and deposited by a dry deposition technique such as vapor deposition, sputtering, or Chemical Vapor Deposition (CVD) process.

When making an attempt to obtain such flat panel displays having a larger area and/or a fine structure, the drive frequency is increased and thereby the resistance of metal interconnections and the parasitic capacitance increase. As a result of this, delay of driving signals comes up as a significant drawback.

Thus, in order to dissolve the delay of driving signals, there has been made an attempt to use Cu having lower electrical resistance (bulk resistivity: 1.7 $\mu\Omega\cdot$cm) as the interconnection material, instead of Al (bulk resistivity: 2.7 $\mu\Omega\cdot$cm), $\alpha$-Ta (bulk resistivity: 13.1 $\mu\Omega\cdot$cm) or Mo (bulk resistivity: 5.8 $\mu\Omega\cdot$cm), which are conventional interconnection materials. As a method for fabricating such metal interconnections, for example, the following (1) and (2) are available:

(1) "Low Resistance Copper Address Line for TFT-LCD" (Japan Display '89, pp. 498–501) discloses discussion results on a TFT-LCD in which Cu is used as the gate electrode material. According to this literature, it is expressly described that because a Cu film (low-resistance metal film) deposited by sputtering process with the aim of lowering the resistance has poor adhesion to the ground glass substrate, a ground metal film such as a metal film of Ta or the like deposited by sputtering process needs to be interveniently provided between the Cu film and the ground glass substrate in order to enhance the adhesion.

(2) Japanese Patent Laid-Open Publication HEI 2-83533 discloses a method of forming the metal interconnections of Cu by using a plating deposition technique without using any dry deposition technique such as sputtering process. In this case, to solve the poor adhesion of Cu film (low-resistance metal film) to the ground oxide (ITO), this method adopts metal interconnections of a Cu/Au/Ni layered structure in which a Ni film (ground metal film) and a Au film (anti-corrosion metal film) deposited. by electroless plating are interveniently provided between the Cu film and the ground oxide.

However, the metal interconnections shown above have the following drawbacks.

In the prior art example (1), in the process of forming a Cu film and a Ta film or the like by a dry deposition technique such as sputtering process for the formation of a Cu/Ta layered film, dry deposition process and etching process are necessary for the Cu film and the Ta film or the like, separately. This causes the number of processes to increase, which leads to a disadvantage of cost increase.

In the prior art example (2), the process of forming a Cu/Au/Ni layered film by plating deposition techniques needs to use electroless plating process for the Ni film. This is because when a metal is plated on an insulating substrate of glass or on an oxide film, a metal film is deposited generally by using electroless plating after a catalyst such as Pd is stuck on the insulating substrate or the oxide film. However, in the presence of a catalyst concentrated portion, i.e., in a poor dispersion of catalyst, there would occur abnormal growth of the Ni film at places where the poor dispersion of catalyst is present. This would inadversely cause minute protrusions on the surface of the deposited Ni film.

FIG. 4 is a schematic sectional view of a Ni film 102 formed by electroless plating on a surface of a glass substrate 101 on which Pd catalyst has been provided. FIG. 4 shows that part of the columnar-grown Ni film 102, where the Pd catalyst is concentrated, is abnormally grown to form a protrusion 103. Such a protrusion failure shown in FIG. 4 is often seen in the process of electroless plating, which is attributed to an effect of the particle size or dispersibility of the Pd catalyst.

Also, in normal plating techniques, even depending on differences in composition, pH, temperature, etc. of the plating bath, the resulting Ni film varies in crystallinity or deposition state. In some cases, the Ni film results in quite a meager state or a sparse state. In such a case, pinholes are prone to occur in the Ni film. When such a poor-quality Ni film is used as the ground, the Cu/Au film stacked on the Ni film is more prone to occurrence of local film floats, so-called "swelling" failures, corresponding to the pinholes of the Ni film.

On this account, in order to avoid adverse effects of film quality failures of pinholes or the like of the Ni film on the upper-layer Cu/Au film, the prior art example (2) describes a method of forming the Ni film of 0.4 $\mu$m or more in thickness, the Au film of 0.1 $\mu$m or more, and the Cu film of 0.8 $\mu$m or more. As a result of this, the total film thickness of metal interconnections composed of the Cu/Au/Ni layered film is 1 $\mu$m or more inevitably. However, because the prior art example (2) was based on the presumption that the metal interconnections are used in peripheral terminal part of a liquid crystal panel, the increase in the film thickness of the metal interconnections was not considered as an issue.

When the metal interconnections are applied not only to peripheral terminal part of the liquid crystal panel but also to bus lines (scan lines and signal lines) within the display area or the like, the increase in film thickness of metal interconnections causes the following drawbacks:

Firstly, in the case of a device structure in which other metal interconnections or thin films are formed on the above metal interconnections, there is a drawback that the other metal interconnections or the thin films cannot fully cover a step gap corresponding to the film thickness of the metal interconnections, i.e., a step gap between the insulating substrate and the metal interconnections, so that disconnections of the other metal interconnections or breaks of the thin films are more prone to occur.

Secondly, when the metal interconnections are used as bus lines within the display area of the liquid crystal panel, there is a drawback that the step gap corresponding to the film thickness of the metal interconnections, i.e., the step gap between the insulating substrate and the metal interconnections is so large that there is a higher probability of occurrence of orientation disturbance of liquid crystal molecules.

Accordingly, in order to use the metal interconnections in a wider variety of applications, the total film thickness of metal interconnections formed of the Cu/Au/Ni layered film is preferably as thin as possible, and more specifically, desired to be designed as not more than 0.5 μm. For implementation of such metal interconnections, it is indispensable to reduce the thickness of the ground Ni film, and improvement in the film quality of the Ni film is strongly demanded.

Therefore, an object of the present invention is to provide a method for fabricating metal interconnections, as well as a wiring board having the metal interconnections, capable of low cost fabrication by omitting dry deposition process or etching process, capable of preventing occurrence of minute protrusions on the surface of the ground metal film as compared with the prior art example (2), and moreover capable of thinning the film thickness.

In order to achieve the above object, present invention provides a method for fabricating metal interconnections, comprising: a first step of forming a first metal film on an insulating substrate by dry deposition technique; a second step of forming a second metal film selectively on the first metal film by wet deposition technique; and a third step of forming a third metal film selectively on the second metal film by wet deposition technique.

According to the invention, the dry deposition process has only to be done one time of the first step. Also, the second metal film is formed selectively on the first metal film, and further the third metal film is formed selectively on the second metal film. Therefore, the patterning process (etching process) has only to be done one time for the first metal film, allowing the number of processes to be decreased, compared with the metal interconnection fabrication method shown in the prior art example (1). Thus, a cost reduction can be achieved.

Also, the first metal film is formed on the insulating substrate by using the dry deposition technique instead of the plating deposition technique involving catalyst impartment. Therefore, compared with the metal interconnection fabrication method shown in the prior art example (2), the pre-plating process for performing catalyst impartment is no longer necessary, so that occurrence of minute protrusions on the surface of the first metal film due to the catalyst can be avoided.

Further, since the first metal film is formed by the dry deposition technique, occurrence of pinholes is completely eliminated even if the first metal film is made thinner. As a result, the first metal film can be made thinner so that the total film thickness of metal interconnections can be made thinner.

In one embodiment of the invention, the wet deposition technique in the second step is electroplating technique or electroless plating technique.

According to the embodiment, the second metal film is formed by electroplating technique or electroless plating technique in the second step. Therefore, the second metal film can be formed only on the first metal film without performing the patterning process for the second metal film.

Also, when the wet deposition technique in the second step is electroless plating technique, the second metal film can be formed to a uniform thickness even if the area of the insulating substrate is increased.

In an embodiment of the invention, the wet deposition technique in the second step is displacement plating technique.

According to the embodiment, since the wet deposition technique in the second step is displacement plating technique, the pre-plating process for performing catalyst impartment is no longer necessary, so that the working efficiency in forming the second metal film can be improved.

In an embodiment of the invention, the wet deposition technique in the third step is electroplating technique or electroless plating technique.

According to the embodiment, the third metal film is formed by electroplating technique or electroless plating technique in the third step. Therefore, the third metal film can be formed only on the second metal film without performing the patterning process for the third metal film.

Also, when the wet deposition technique in the third step is electroless plating technique, the third metal film can be formed to a uniform thickness even if the area of the insulating substrate is increased.

In an embodiment of the invention, the wet deposition technique in the third step is electroless plating technique; and the second metal film has a catalytic action for deposition reaction of the third metal film.

According to the embodiment, the third metal film is formed by electroless plating in the third step. In this process, since the second metal film has catalytic action for the deposition reaction of the third metal film, the catalyst impartment of the pre-processing performed by electroless plating is no longer necessary so that the working efficiency in forming the third metal film can be improved.

In an embodiment of the invention, the first metal film is a metal film whose principal component is at least one of Ni, Ta, Mo, Cr, Ti and Al.

According to the embodiment, the first metal film contains, as a principal component, at least one of Ni, Ta, Mo, Cr, Ti and Al. Therefore, the first metal film can be formed on the insulating substrate easily with good adhesion by using a dry deposition technique such as sputtering process or vapor deposition process.

In an embodiment of the invention, the second metal film is a metal film whose principal component is a noble metal.

According to the embodiment, since the second metal film is a metal film whose principal component is a noble metal superior in corrosion resistance, oxide is less likely to be formed on the surface of the second metal film, which is the noble metal film. Therefore, no oxide is present between the second metal film and the third metal film that is formed on the second metal film, so that the third metal film can be formed on the second metal film with good adhesion by electroplating technique or electroless plating technique.

In an embodiment of the invention, the second metal film is a metal film whose principal component is Au.

According to the embodiment, since the second metal film contains, as a principal component, Au of low resistivity, the resistance value of the layered film composed of the first metal film and the second metal film becomes low, making it easier to pass electric current through the layered film. Accordingly, with the use of electroplating technique in the third step, since electric current is passed through the layered film composed of the first metal film and the second metal film, it is. advantageous that the layered film is of low resistance. Further, since Au is an expensive noble metal, making the second metal film as thin as possible and using an inexpensive material for the third metal film makes it possible to manufacture the metal interconnections with lower cost.

In an embodiment of the invention, the third metal film is a metal film whose principal component is at least one of Cu and Ag.

According to the embodiment, since the third metal film contains, as a principal component, at least one of Cu with a bulk resistivity of 1.7 $\mu\Omega\cdot$cm and Ag with a bulk resistivity of 1.6 $\mu\Omega\cdot$cm, the third metal film becomes lower in resistivity. Therefore, Cu and Ag are best suited as the material of low-resistance metal interconnections.

In particular, Cu is long in life against electromigration, and moreover inexpensive, thus superior in that the cost for manufacturing metal interconnections can be reduced.

In an embodiment of the invention, the method for fabricating metal interconnections further comprising: a fourth step of forming a cap film on the third metal film by wet deposition technique.

According to the embodiment, since the cap film is formed on the third metal film by wet deposition technique so as to cover the third metal film, the third metal film is prevented from being exposed to the atmospheric air. Therefore, the third metal film can be prevented from oxidizing.

In an embodiment of the invention, the wet deposition technique in the fourth step is electroplating technique or electroless plating technique.

According to the embodiment, since the cap film is formed by electroplating technique or electroless plating technique in the fourth step, the cap film can be formed only on the third metal film without performing the patterning process for the cap film.

Also, when the wet deposition technique in the fourth step is electroless plating technique, the cap film can be formed to a uniform thickness even if the area of the insulating substrate is increased.

In an embodiment of the invention, a wiring board has metal interconnections obtained by the above method for fabricating metal interconnections.

According to the embodiment, since the metal interconnections can be made thinner in film thickness, their availability can be improved.

The present invention also provides a method for fabricating metal interconnections, comprising: a first step of forming a ground metal film on an insulating substrate by dry deposition technique; a second step of patterning the ground metal film into a specified pattern; a third step of forming an anti-corrosion metal film on the patterned ground metal film by electroplating technique or electroless selective plating technique; and a fourth step of forming a low-resistance metal film on the anti-corrosion metal film by electroplating technique or electroless selective plating technique.

According to the invention, the dry deposition process has only to be done one time in the first step, and the patterning process (etching process) has only to be done one time in the second step. Therefore, the number of processes involved in the method is smaller than in the metal interconnection fabricating method shown in the prior art example (1) Thus, a cost reduction can be achieved.

Also, the ground metal film is formed on the insulating substrate by using the dry deposition technique instead of the plating deposition technique involving catalyst impartment. Therefore, compared with the metal interconnection fabrication method shown in the prior art example (2), the pre-plating process for performing catalyst impartment is no longer necessary, so that occurrence of minute protrusions on the surface of the ground metal film due to the catalyst can be avoided.

Further, when the electroless selective plating technique is used in the third step and the fourth step, the film thickness uniformity of the anti-corrosion metal film and the low-resistance metal film can be improved over the case where the electroplating technique is used.

In an embodiment of the invention, the ground metal film is a metal film whose principal component is Ni.

According to the embodiment, since the ground metal film is a metal film whose principal component is Ni, the ground metal film can be formed on the insulating substrate simply with good adhesion by using dry deposition technique such as sputtering process or vapor deposition process.

In an embodiment of the invention, the anti-corrosion metal film is a metal film whose principal component is Au.

According to the embodiment, since the anti-corrosion metal film is a metal film whose principal component is Au superior in corrosion resistance, no oxide is formed on the surface of the anti-corrosion metal film. Therefore, no oxide is present between the anti-corrosion metal film and the low-resistance metal film that is formed on the anti-corrosion metal film, so that the low-resistance metal film can be formed on the anti-corrosion metal film with good adhesion by electroplating technique or electroless selective plating technique.

Also, since the anti-corrosion metal film is made principally of low-resistivity Au, the layered film composed of the ground metal film and the anti-corrosion metal film is low in resistance value, so that electric current can be passed more easily through the layered film. Accordingly, with the use of the electroplating technique in the fourth step, since electric current is passed through the layered film composed of the ground metal film and the anti-corrosion metal film, it is advantageous that the layered film is of low resistance. Further, since Au is an expensive noble metal, thinning the anti-corrosion metal film as much as possible and using an inexpensive material for the low-resistance metal film makes it possible to manufacture the metal interconnections with low price.

In an embodiment of the invention, the low-resistance metal film is a metal film whose principal component is Cu.

According to the embodiment, the low-resistance metal film is a metal film whose principal component is Cu, which is low in resistivity (bulk resistivity: 1.7 $\mu\Omega\cdot$cm) and long in life against electromigration, thus optimal as a material of low-resistance metal interconnections. Also, since Cu is inexpensive, the manufacturing cost for metal interconnections can be reduced.

In an embodiment of the invention, the electroless selective plating technique in the third step is displacement plating.

According to the embodiment, since the electroless selective plating technique in the third step is displacement plating, the pre-processing for performing catalyst impartment is no longer necessary so that the working efficiency in the formation of the anti-corrosion metal film can be improved.

Also, by virtue of the fact that the electroless selective plating technique in the third step is displacement plating, even if a natural oxide film is formed at the surface layer of the ground metal film, and if the natural oxide film is thin, the displacement plating solution penetrates through natural oxide film. Therefore, it becomes possible to form an anti-corrosion metal film on the surface of the ground metal film.

In an embodiment of the invention, the method for fabricating metal interconnections further comprises a fifth step of forming a cap film on the low-resistance metal film by electroplating technique or electroless selective plating technique.

According to the embodiment, since the cap film is formed on the low-resistance metal film by electroplating technique or electroless selective plating technique, the low-resistance metal film is not exposed to the atmospheric air so that the low-resistance metal film can be prevented from oxidizing.

DETAILED DESCRIPTION OF THE PREFERRED EMBODIMENTS

Hereinbelow, a method for fabricating metal interconnections according to the present invention and a wiring board having the metal interconnections fabricated by the above method are described in detail by way of embodiments thereof with reference to the accompanying drawings. These embodiments are explained based on an assumption that the method for fabricating metal interconnections of the invention is applied to metal interconnections of an active matrix drive type LCD.

FIGS. 1A to 1D are process views showing an embodiment of the method for fabricating metal interconnections according to the present invention.

(First Step)

Figure 1A:
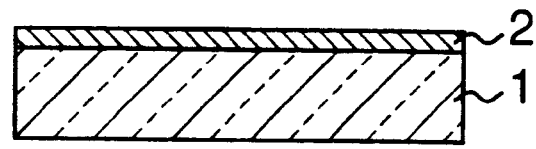
FIGS. 1A to 1D are process views showing an embodiment of a method for fabricating a metal interconnection according to the present invention.

First, the surface of an insulating substrate 1 of glass or the like shown in FIG. 1A is degreased and cleaned by using alkali or acid or an organic solvent. In this process, using ultrasonic cleaning in combination helps for effective cleaning. Then, on the surface of the insulating substrate 1, a Ni film 2 as a ground metal film (first metal film) is formed by using a direct current magnetron sputtering process as a dry deposition technique. The thickness of this Ni film 2 is about 0.1 to 0.2 $\mu$m. However, since this film is obtained by the dry deposition technique in a vacuum environment, the Ni film 2 can be obtained as a film absolutely free from protrusion failures and pinholes and excellent in surface morphology even though being a thin film having a thickness of 0.2 $\mu$m or less. Besides, the Ni film 2 can be easily formed on the insulating substrate 1 by DC magnetron sputtering process.

Also, even when a dry deposition technique such as CVD process or vapor deposition is used instead of the DC magnetron sputtering process, a Ni film 2 exhibiting good adhesion with the insulating substrate 1 can be easily formed. This dry deposition technique is a film deposition technique such as vapor deposition, sputtering and CVD, generically referring to film deposition techniques using a vacuum system.

The film material (ground metal film) formed on the insulating substrate 1 is not limited to Ni. Any film materials may be used if they have good adhesion to the insulating substrate 1. However, when an Au film is formed on the ground metal film by displacement plating, Ni is desirable for the ground metal film. Ta, Mo, Cr, Ti and Al as well as Ni are desirable for the ground metal film to be formed on the insulating substrate 1. In short, the film to be formed on the insulating substrate 1 has only to contain, as its principal component, at least one of Ni, Ta, Mo, Cr, Ti and Al. The reason for this is that Ni has a good Au-displacement characteristic while Ta, Mo, Ti, Cr and Al are displaceable with Au. Ta, Mo, Ti, Cr and Al are widely used in the field of liquid crystal displays and have good adhesion to the glass substrate. Hereinafter, the description proceeds on a case in which Ni is used as the ground metal film.

It is noted that the insulating substrate in the present invention includes glass, ceramic substrates or inorganic substrates such as semiconductor substrates (or conductor substrates) having an insulating layer on the surface thereof.

Figure 1B:
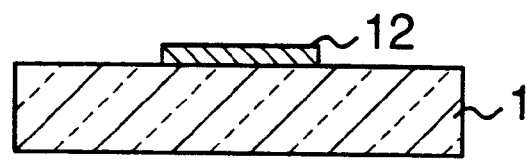

Next, the Ni film 2 is patterned into a specified wiring pattern, resulting in a Ni film 12 of the wiring pattern as shown in FIG. 1B. This patterning is performed by normal photolithography technique and etching technique. More specifically, although not shown, after a positive type photoresist is applied onto the Ni film, the photoresist is exposed to light with a photomask and then patterned by alkali development. Thereafter, etching process is performed with a commercially available Ni etchant, so that unnecessary Ni film is removed. Finally, the resist is removed with a resist stripping solution, where the Ni film 12 of the wiring pattern shown in FIG. 1B is completed.

(Second Step)

Figure 1C:
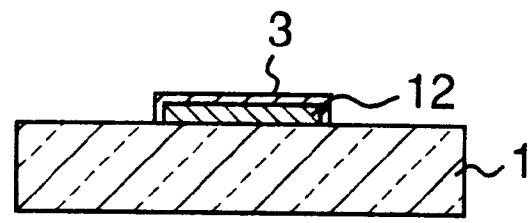

Next, as shown in FIG. 1C, on the surface of the Ni film 12 of the wiring pattern obtained by the above first step, a Au film 3 as an anti-corrosion metal film (second metal film) is formed to a thickness of 0.01 to 0.1 $\mu$m, preferably 0.02 to 0.05 $\mu$m, by using electroless plating process as an electroless selective plating technique.

Like this, since the Ni film 12 is covered with the Au film 3, the Ni film 12 is not exposed to the atmospheric air, so that the Ni film 12 can be prevented from surface oxidation. Also, the Au film 3 is less likely to oxidize at its surface by virtue of its high corrosion resistance. Since this Au film 3 is formed by electroless selective plating process, the Au film 3 is superior in uniformity of film thickness.

Further, in the present invention, the ground Ni film 12 is a film obtained by dry deposition technique as described above, thus superior in surface morphology, compared with Ni films obtained by wet deposition techniques such as plating. Thus, even if the thickness of the Au film 3 as an anti-corrosion metal film is not more than 0.1 $\mu$m, the surface of the Ni film 12 can be completely covered with the Au film 3.

Whereas the electroless plating process includes displacement plating process, reduction plating process, thermal decomposition plating process and the like, the Au film 3 is desirably formed by displacement plating process, taking into consideration that catalyst impartment is unnecessary, that its adhesion with the Ni film 12 of the wiring pattern is superior, and that selective plating is possible at places where the Ni film 12 is present. When the displacement plating process is used, there is no need of catalyst impartment for the formation of the Au film 3, so that the working efficiency can be improved. In addition, neutral non-cyanic plating solutions are preferably used for the electroless displacement plating solution rather than cyanic plating solutions in terms of the working environment.

In the above case, the Au film 3 is formed on the surface of the Ni film 12 of the wiring pattern by electroless plating as an electroless selective plating technique. However, the Au film may also be formed on the surface of the Ni film of the wiring pattern by using electroplating process as an electroplating technique.

Besides, the material of the anti-corrosion metal film is not limited to Au alone, but has only to be a noble metal.
(Third Step)

Figure 1D:
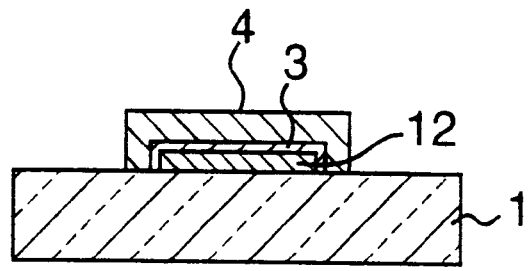

Next, as shown in FIG. 1D, on the layered film of the Au film 3 and the Ni film 12, a Cu film 4 as a low-resistance metal film (third metal film) is formed to a thickness of 0.1 to 0.5 μm by using electroplating process as an electroplating technique. In this process, by passing a specified electric current through the layered film composed of the Au film 3 and the Ni film 12, Cu is deposited on the surface of the Au film 3, by which the Cu film 4 is formed on the Au film 3. The layered film includes the Au film 3 and therefore low in resistance value, so that electric current can be easily passed through the layered film. Therefore, the electroplating process for forming the Cu film 4 on the Au film 3 can be easily carried out. It is noted that setting the thickness of the Cu film 4 to 0.1 through 0.5 μm makes it possible to obtain a sufficiently low resistance of metal interconnections.

Also, by adjusting the conduction time over which the electric current continues to be passed through the layered film of the Au film 3 and the Ni film 12, the film thickness of the Cu film 4 can be set arbitrarily. Therefore, the Cu film 4 can be formed in such a film thickness that a required sheet resistance of metal interconnection can be obtained.

Also, since the ground of the Cu film 4 is given by the Au film 3, a good adhesion of the Cu film 4 to the Au film 3 can be obtained. Besides, since Cu is inexpensive, the manufacturing cost can be reduced. In addition, as the material of the metal film to be deposited by the electroplating process, copper, nickel, tin, gold, silver, chromium, palladium, rhodium, tin-lead, and the like are available.

In this process, the Cu film 4 is formed on the Au film 3 by using electroplating process. However, the Cu film 4 may be formed selectively only on the Au film 3 by using an electroless plating process with the ground Au film 3 taken as a catalyst. In this case, electroless plating process is capable of forming a Cu film having a better uniformity of film thickness, than electroplating process, thus advantageous in forming the metal interconnections in a large-area substrate. Also, in the case of metal interconnections for an active matrix drive type LCD, Cu and Ag are optimal as the material of the low-resistance metal film in terms of material cost and resistance.

Further, Cu and Ag are generally difficult to dry etch and difficult to precisely control in wet etching, thus having hitherto been difficult to finely pattern. However, when the ground Au/Ni film pattern is formed into a finer pattern by depositing Cu and Ag selectively on the ground Au/Ni film pattern, it becomes possible to form a finer pattern of Cu and Ag with ease.

As shown above, in the first through third steps, sputtering or other dry deposition process or etching process has to be done only one time in the first process. Accordingly, as compared with the prior art example (1) that involves sputtering or other dry deposition process and etching process individually for the Cu film, the Ta film or the like, necessary processes can be simplified so that the manufacturing cost can be reduced.

Also, since the Ni film 2 is formed by using dry deposition technique instead of the plating deposition technique of the prior art example (2) that involves catalyst impartment, the pre-plating process for performing catalyst impartment is no longer necessary, so that occurrence of minute protrusions on the surface of the Ni film 2 due to the catalyst can be prevented.

Also, even if the Ni film 2 or the Au film 3 is not so thick as the prior art example (2), occurrence of swelling failures of the Cu film 4 can be prevented. Therefore, the total thickness of the metal interconnection (Ni/Au/Cu layered film) can be made thinner than that of the prior art example (2).

Figure 2:
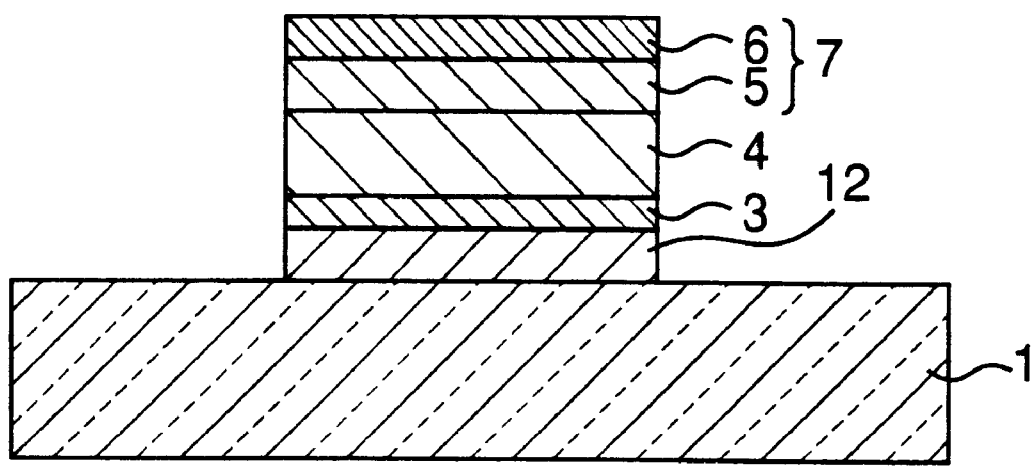
FIG. 2 is a schematic sectional view of the metal interconnection on the surface of which a cap film is formed.

It is also possible to perform a fourth step of forming a cap film by using electroplating technique or electroless selective plating technique on the surface of the metal interconnection (Ni/Au/Cu layered film) obtained by performing the first to third steps. For example, when a cap film 7 is formed on the surface of the metal interconnection as shown in FIG. 2, this cap film 7 serves as a protective film for the metal interconnection. This cap film 7 is composed of a Ni film 5 stacked on the Cu film 4, and a Au film 6 stacked on the Ni film 5. Referring to the method for forming this cap film 7, for example, the substrate, on the surface of which the metal interconnection (Ni/Au/Cu layered film) shown in FIG. 1D are formed, is subjected to a catalyst impartment process as required, and then dipped into an electroless plating solution. Then, the Ni film 5 is selectively deposited only on the metal interconnection (Cu film 4). Then, for example, by using the same process as in the second step, the Au film 6 is formed on the Ni film 5. Like this, by forming the cap film 7 on the metal interconnections (Cu film 4), the Cu film 4 (low-resistance metal film) is kept from direct contact with the atmospheric air, so that the Cu film 4 can be prevented from oxidation.

The fourth step is particularly effective when a Cu film is used as the low-resistance metal film. This is because the cap film 7 (Ni film, Au film) plays a role as an oxygen blocking film against the Cu film 4, which is so oxidation-prone as to be completely oxidized up to the film inside. Oxidation of the Cu film can be prevented even without the cap film when the surface of the Cu film is overcoated with an organic film immediately after the deposition of the Cu film, or when the surface of the metal film is covered with an nonoxide such as SiNx immediately after the deposition of the Cu film in terms of device structure.

Further, silver and chromium instead of Ni and Au may also be used for the material of the cap film in the fourth step.

Figure 3:
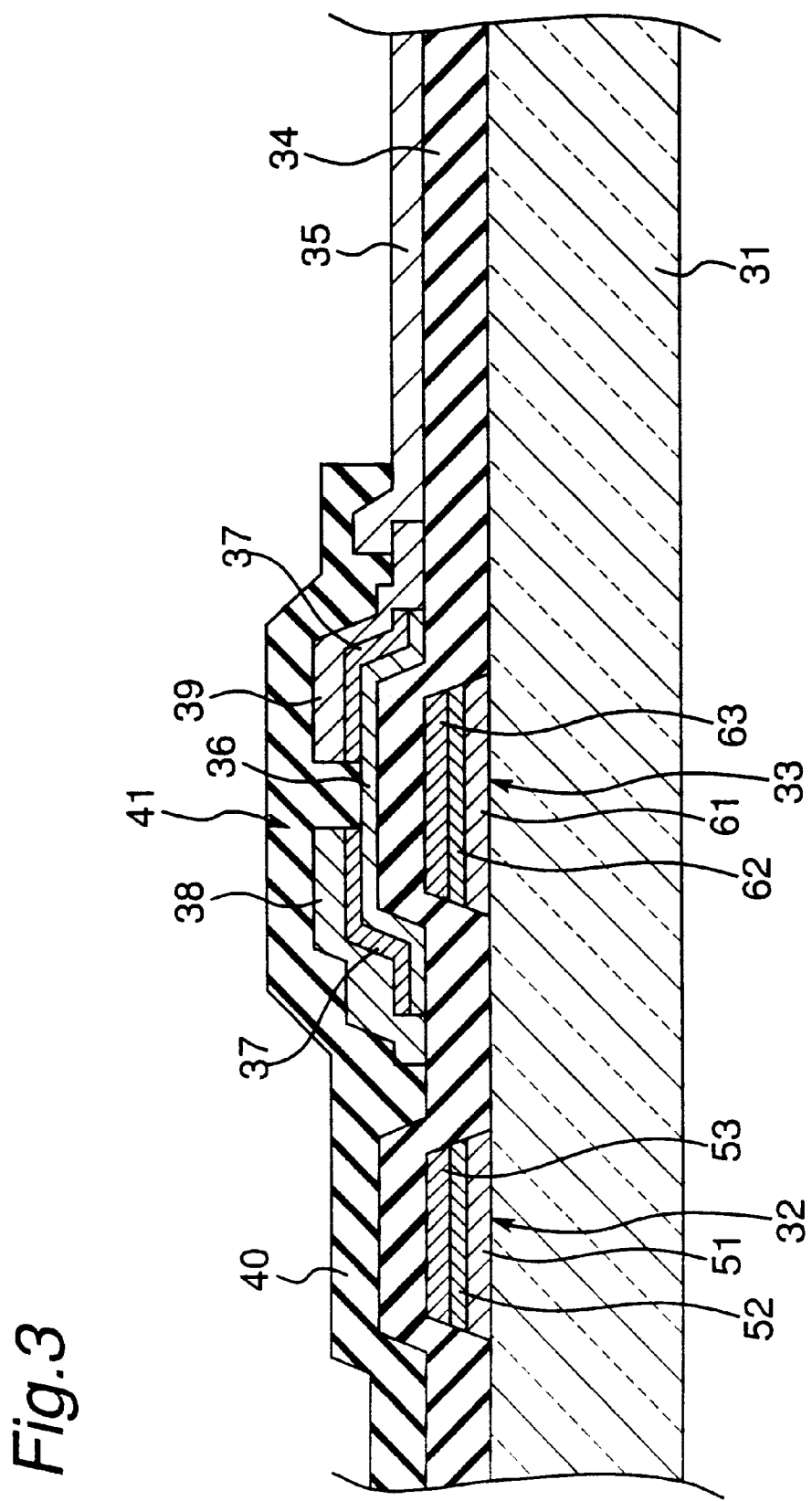
FIG. 3 shows a sectional view of an active matrix substrate having metal interconnections formed by the method for fabricating metal interconnections according to the invention.
Figure 4:
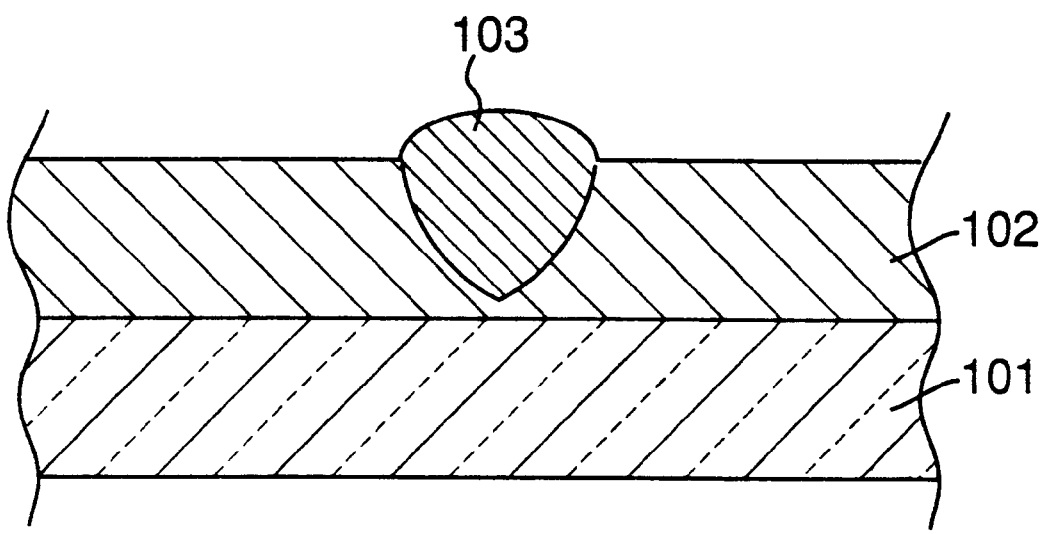
FIG. 4 is a schematic sectional view of a Ni film formed on a glass substrate by electroless plating.

FIG. 3 shows a sectional view of an active matrix substrate having metal interconnections formed by the method for fabricating metal interconnections according to the present invention. As shown in FIG. 3, a gate connection 32 and a gate electrode 33 are formed on a glass substrate 31. The gate connection 32 and the gate electrode 33 are composed of a Ni film 51, 61 as a ground metal film deposited to a thickness of 0.17 μm, a Au film 52, 62 as an anti-corrosion metal film deposited to a thickness of 0.03 μm, and a Cu film 53, 63 as a low-resistance metal film deposited to a thickness of 0.3 μm, respectively. The sheet resistance of these gate connection 32 and gate electrode 33 is not more than 0.1 Ω/□. Further on the gate connection 32 and the gate electrode 33, is formed a gate insulator 34 made of SiNx by CVD process. Besides, a TFT device 41 composed of a channel layer 36 made of a-Si, a contact layer 37 made of n$^+$ type a-Si, and a source electrode 38 and a drain electrode 39 made of Al is formed on the gate electrode 33. This TFT device 41 is covered with an insulation protective film 40 made of SiNx. Also, between an end portion of this insulation protective film 40 and an end portion of the drain electrode 39, part of a pixel electrode 35 made of ITO (Indium-Tin-Oxide) is interposed.

It was confirmed that such a TFT device 41 exhibits characteristics generally similar to those of TFT devices having a conventional gate electrode formed by using only a dry deposition technique such as sputtering process. It was also found that this TFT device 41 is applicable to the active matrix drive type LCD. Although the TFT device 41 has been provided above in inverted staggered structure (bottom gate structure), yet the TFT device 41 may be in staggered structure (top gate structure). Further, active matrix substrates using MIM (Metal Insulator Metal), BTB (Back-To-Back diodes), diode ring, varistor, plasma switching and the like as well as TFTs may also be widely applied to display devices and image sensors. Besides, the structure of metal interconnections is applicable also to wiring boards having no active devices, and a passive matrix type display device can also be made up with such a wiring board.

Although the above embodiment has been described on an active matrix substrate used for LCDs, the display device is not limited to this and the invention may be widely applied to display devices adopting optical media other than liquid crystals as display media, including every kind of display device that involves metal interconnections such as:

plasma display devices (PDPs), inorganic or organic EL display devices, electrochromic display devices, electrophoretic display devices, field emission display devices, and, in particular, display devices to which lower resistance, larger area, cost reduction and the like are demanded.

Furthermore, the method of manufacturing metal interconnections according to the present invention can also be applied widely to the whole field of active matrix drive type and passive matrix drive type flat panel displays, two-dimensional image sensor devices in the form of flat panel, and every type of electronic equipment having metal interconnections.

The invention being thus described, it will be obvious that the same may be varied in many ways. Such variations are not be regarded as a departure from the spirit and scope of the invention, and all such modifications as would be obvious to one skilled in the art are intended to be included within the scope of the following claims.

What is claimed is:

1. A method for fabricating metal interconnections, comprising:

a first step of forming a first metal film on an insulating substrate by a dry deposition technique;

a second step of forming a second metal film selectively on the first metal film by displacement plating technique; and a third step of forming a third metal film selectively on the second metal film by electroplating technique or electroless plating technique using the second film as a catalyst.

2. The method for fabricating metal interconnections according to claim 1, wherein:

the second metal film has a thickness of between 0.01 $\mu$m and 0.1 $\mu$m.

3. The method for fabricating metal interconnections according to claim 1, wherein the first metal film is a metal film whose principal component is at least one of Ni, Ta, Mo, Cr, Ti and Al.

4. The method for fabricating metal interconnections according to claim 1, wherein the second metal film is a metal film whose principal component is a noble metal.

5. The method for fabricating metal interconnections according to claim 4, wherein the second metal film is a metal film whose principal component is Au.

6. The method for fabricating metal interconnections according to claim 1, wherein the third metal film is a metal film whose principal component is at least one of Cu and Ag.

7. The method for fabricating metal interconnections according to claim 1, further comprising:

a fourth step of forming a cap film on the third metal film by wet deposition technique.

8. The method for fabricating metal interconnections according to claim 7, wherein the wet deposition technique in the fourth step is electroplating technique or electroless plating technique.

9. A method for fabricating metal interconnections, comprising:

a first step of forming a ground metal film on an insulating substrate by dry deposition technique;

a second step of patterning the ground metal film into a specified pattern;

a third step of forming an anti-corrosion metal film selectively on the patterned ground metal film by displacement plating technique; and a fourth step of forming a low-resistance metal film on the anti-corrosion metal film by electroplating technique or electroless plating technique using the anti-corrosion metal film as a catalyst.

10. The method for fabricating metal interconnections according to claim 9, wherein the ground metal film is a metal film whose principal component is Ni.

11. The method for fabricating metal interconnections according to claim 10, wherein:

the low-resistance metal film is a metal film whose principal component is Cu.

12. The method for fabricating metal interconnections according to claim 9, wherein the anti-corrosion metal film is a metal film whose principal component is Au.

13. The method for fabricating metal interconnections according to claim 12, wherein:

the low-resistance metal film is a metal film whose principal component is Cu.

14. The method for fabricating metal interconnections according to claim 9, wherein:

the low-resistance metal film is a metal film whose principal component is Cu.

15. The method for fabricating metal interconnections according to any one of claims 9, 11 or 13 further comprising:

a fifth step comprising forming a cap film on the low-resistance film by electroplating technique or electroless selective plating technique.

16. The method for fabricating metal interconnections according to claim 9, wherein:

the anti-corrosion metal film has a thickness of between 0.01 $\mu$m and 0.1 $\mu$m.

17. A method for fabricating metal interconnections on a continuous, substantially flat surface of an insulating substrate, said method comprising the following steps:

a first step comprising forming a first metal film having a thickness of between about 0.1 $\mu$m and about 0.2 $\mu$m on said continuous, substantially flat surface of said insulating substrate by a dry deposition technique;

a second step comprising forming a second metal film having a thickness of between about 0.01 $\mu$m and about 0.1 $\mu$m selectively on the first metal film by a wet deposition technique; and a third step comprising forming a third metal film having a thickness between about 0.2 $\mu$m and about 0.4 $\mu$m selectively on the second metal film by a wet deposition technique;

wherein the metal interconnections so fabricated are no more than about 0.5 $\mu$m thick.

18. A method for fabricating metal interconnections on a continuous, substantially flat surface of an insulating substrate, said method comprising the following steps:

a first step comprising forming a ground metal film having a thickness of between about 0.1 $\mu$m and about 0.2 $\mu$m on said continuous, substantially flat surface of said insulating substrate by a dry deposition technique;

a second step comprising patterning the ground metal film into a specified pattern;

a third step comprising forming an anti-corrosion metal film having a thickness of between about 0.0 $\mu$m and about 0.1 $\mu$m selectively on the patterned ground metal film by an electroplating technique or an electroless plating technique; and a fourth step comprising forming a low-resistance metal film having a thickness between about 0.2 $\mu$m and about 0.4 $\mu$m selectively on the anti-corrosion metal film by a wet deposition technique;

wherein the metal interconnections so fabricated are no more than about 0.5 $\mu$m thick.

* * * * *